United States Patent
Wu et al.

(10) Patent No.: US 8,394,575 B2
(45) Date of Patent: Mar. 12, 2013

(54) FORMULATIONS FOR ENVIRONMENTALLY FRIENDLY PHOTORESIST FILM LAYERS

(75) Inventors: Xiaoming Wu, Lexington, KY (US); David Graham, Lexington, KY (US); Sean Weaver, Union, KY (US); Bart Mansdorf, Lexington, KY (US); Rich Wells, Westerville, OH (US); Joel Provence, Delaware, OH (US)

(73) Assignee: Lexmark International, Inc., Lexington, KY (US)

( * ) Notice: Subject to any disclaimer, the term of this patent is extended or adjusted under 35 U.S.C. 154(b) by 165 days.

(21) Appl. No.: 12/894,930

(22) Filed: Sep. 30, 2010

(65) Prior Publication Data
US 2012/0082933 A1   Apr. 5, 2012

(51) Int. Cl.
*G03F 7/004* (2006.01)

(52) U.S. Cl. .................. 430/280.1; 430/921; 522/31

(58) Field of Classification Search .................. None
See application file for complete search history.

(56) References Cited

U.S. PATENT DOCUMENTS

| | | | | |
|---|---|---|---|---|
| 5,332,797 | A * | 7/1994 | Kessel et al. | 528/27 |
| 6,111,143 | A * | 8/2000 | Park et al. | 568/35 |
| 2005/0113474 | A1 * | 5/2005 | Kropp et al. | 522/1 |
| 2007/0076059 | A1 * | 4/2007 | Patil et al. | 347/65 |
| 2007/0076060 | A1 * | 4/2007 | Weaver et al. | 347/68 |
| 2009/0197987 | A1 * | 8/2009 | Hayoz et al. | 522/17 |
| 2011/0318882 | A1 * | 12/2011 | Wu et al. | 438/118 |
| 2011/0319513 | A1 * | 12/2011 | Wu et al. | 522/27 |

OTHER PUBLICATIONS

Padmanaban et al Advances in Resist Technology and Processing XX, Theodore H. Fedynyshyn, Editor,Proceedings of SPIE vol. 5039 (2003) © 2003 SPIE • 0277-786X/03. pages 743-751.*

* cited by examiner

*Primary Examiner* — Cynthia Hamilton

(57) ABSTRACT

Environmentally friendly thick film layers for a micro-fluid ejection head and micro-fluid ejection heads are disclosed. The environmentally friendly thick film layer includes a negative photoresist layer derived from a composition comprising a multi-functional epoxy compound, a low molecular weight polymeric difunctional epoxy compound, a monomeric difunctional epoxy compound, a methide-based photoacid generator that does not contain antimony, a chromophore and an aryl ketone solvent. Optionally the photoresist layer contains an adhesion enhancer. The negative photoresist layer is environmentally friendly and provides good resolution, well defined critical dimensions, straight side walls, and a large processing window.

11 Claims, No Drawings

FORMULATIONS FOR ENVIRONMENTALLY FRIENDLY PHOTORESIST FILM LAYERS

FIELD OF THE INVENTION

Disclosed are i-line radiation curable resin formulations that are useful in micro-fluid ejection heads such as micro-electromechanical systems ("MEMS") components, biological MEMS components, microfluidic components and ink jet printer components. The radiation cured formulation produces a photoimageable photoresist layer on the micro-fluid ejection head that is environmentally friendly. Moreover ink jet printer components, namely an ink jet printheads, manufactured with this photoresist layer have good image resolution ratios and aspect ratios.

BACKGROUND AND SUMMARY

Micro-fluid ejection heads found in micro-fluid ejection devices, such as ink jet printers continue to technologically evolve. These micro-fluid ejection heads are made with nozzle members, such as nozzle plates, containing flow features. One technological advance in making improved micro-fluid ejection heads is the use of a thick photoresist layer applied to a device surface of the substrate. The thick film layer is imaged to provide the flow features for the micro-fluid ejection heads. Use of the photoimageable thick film layer enables more accurate alignment between the flow features and ejection actuators on the device surface of the substrate. However it is also important that the photoresist layer is capable providing good imaging performance including crisp images, high aspect ratio, straight side walls, and a large processing window. Moreover the thickness of the thick film needs to be between 5 microns and 30 microns.

However there are environmental problems with the photoresist layers found in the micro fluid ejection heads in the market today, namely the existence of the harmful element antimony. Antimony and its compounds are considered to be hazardous and harmful pollutants by the United States Environmental Protection Agency and the European Union. Acute or short term exposure to antimony by inhalation in humans results in effects to the skin and eyes. Chronic exposure to antimony can lead to inflammation of the lungs, chronic bronchitis, and chronic emphysema. Waterborne antimony pollutant is very toxic. Ingesting contaminated water can cause severe sickness. In fact the European Union is even considering a future ban of products containing antimony because of the potential health risks associated with antimony. Accordingly, there is a need for an antimony-free photoresist formulation that is environmentally friendly.

Another detriment to using photoresist layers containing an antimony based photoacid generator is the existence of hydrofluoric acid in the photoresist layer. Many photoresist layers are manufactured with a hexafluoroantimonate photoacid generator. The decomposition of $SbF_6^-$ ion generates hydrofluoric acid which remains in a micro-fluid ejection head such as an ink jet printhead. Since hydrofluoric acid is very corrosive, erosion of the wiring of the printhead could occur. Hydrofluoric acid contaminated ink channels can induce ink settlement and more seriously block the ink channels on the flow features on the printhead. The existence of hydrofluoric acid can thereby lead to a failure of the printhead.

As explained above, flow features are photo lithographically processed. The photoresist layer containing an antimony based photoacid generator has to be 'bumped' with an overdose of ultraviolet light and 'baked' in a convection oven at 200 C for 2 hours. The 'bump and bake' step is necessary to drive out the undesirable hydrofluoric acid. Unfortunately, the high thermal stress induced on the photoresist layer during the bump and bake process has proven to be detrimental from a chemical, physical, and mechanical properties standpoint. It would be beneficial from a manufacturing standpoint to have a printhead that would not need to go through this harsh bump and bake process. Accordingly, it would be beneficial to have a photoresist formulation that does not contain hydrofluoric acid.

There is provided a thick film layer as ink flow feature for a micro-fluid ejection head. The thick film layer includes a negative photoresist layer derived from a composition containing a multi-functional epoxy compound, a first and second difunctional epoxy compound, a methide-based photoacid generator that does not contain antimony, a chromophore, and an aryl ketone solvent. Optionally the photoresist layer contains an adhesion enhancer. The methide-based photoacid generator is i-line sensitive. Use of an i-line sensitive photoacid generator also alleviates the need to use a photosensitizer in the thick film layer. The absence of the photosensitizer keeps down the cost of manufacture of the thick film photoresist layer. The negative photoresist layer is environmentally friendly and provides improved image performance including flow features with crisp images, straight or vertical side walls and a large processing window. The environmentally friendly thick film photoresist layer is derived from a low molecular weight polymeric difunctional epoxy component having a weight average molecular weight ranging from about 2500 to about 4000 Daltons, a monomeric difunctional epoxy component, a multifunctional epoxy resin, a tris-aryl-sulfonium tris(trisfluoromethanesulfonyl) methide, i-line sensitive photoacid generator, an aryl ketone solvent, a chromophore, and an optional adhesion enhancing component. Another formulation which may be used to provide an environmentally friendly thick film layers is derived from a low molecular weight polymeric difunctional epoxy component having a weight average molecular weight ranging from about 2500 to about 4000 Daltons, a monomeric difunctional epoxy component, a multifunctional epoxy resin, a tris-aryl-sulfonium tris(trisfluoromethanesulfonyl) methide, i-line sensitive photoacid generator, an aryl ketone solvent. For purposes of this disclosure, "difunctional epoxy" means epoxy compounds and materials having only two epoxy functional groups in the molecule. "Multifunctional epoxy" means epoxy compounds and materials having more than two epoxy functional groups in the molecule.

DETAILED DESCRIPTION OF EXEMPLARY EMBODIMENTS

An environmentally friendly photoresist formulation that provides the thick film layer according to one embodiment of the disclosure includes a multi-functional epoxy compound, a low molecular weight polymeric difunctional epoxy component, a monomeric difunctional epoxy component, a methide-based, i-line sensitive photoacid generator, a non-reactive solvent, and, optionally, an adhesion enhancing agent.

It is believed that the mixtures of these different epoxy resins provide many benefits to the photoresist formulation. Higher molecular weight resins act as binders, providing film formation capability and mechanical strength. Lower molecular weight resins and monomeric resins act a flexibilizers and plasticizers prior to curing. These epoxy resins also act as crosslinkers during the curing step.

Another formulation which may be used to provide environmentally friendly thick film layers is derived from a low molecular weight polymeric difunctional epoxy component having a weight average molecular weight ranging from about 2500 to about 4000 Daltons, a monomeric difunctional epoxy component, a multifunctional epoxy resin, a tris-arylsulfonium tris(trisfluoromethanesulfonyl) methide, i-line sensitive photoacid generator, and an aryl ketone solvent.

The low molecular weight polymeric difunctional epoxy component may be selected from difunctional epoxy compounds which include diglycidyl ethers of bisphenol-A (e.g. those available under the trade designations "EPON 1007F", "EPON 1007" and "EPON 1009F", available from Shell Chemical Company of Houston, Tex., "DER-331", "DER-332", and "DER-334", available from Dow Chemical Company of Midland, Mich., 3,4-epoxycyclohexylmethyl-3,4-epoxycyclo-hexene carboxylate (e.g. "ERL-4221" available from Union Carbide Corporation of Danbury, Conn., 3,4-epoxy-6-methylcyclohexylmethyl-3,4-epoxy-6-methylcyclohexene carboxylate (e.g. "ERL-4201" available from Union Carbide Corporation), bis(3,4-epoxy-6-methylcyclohexylmethyl)adipate (e.g. "ERL-4289" available from Union Carbide Corporation), and bis(2,3-epoxycyclopentyl)ether (e.g. "ERL-0400" available from Union Carbide Corporation.

An exemplary low molecular weight polymeric difunctional epoxy component is a bisphenol-A/epichlorohydrin epoxy resin available from Shell Chemical Company of Houston, Tex. under the trade name EPON resin 1007F having an epoxide equivalent of greater than about 1000. An "epoxide equivalent" is the number of grams of resin containing 1 gram-equivalent of epoxide. The weight average molecular weight of the difunctional epoxy component is typically above 2500 Dalton, from about 2800 to about 3500 Daltons. The amount of difunctional epoxy component in the photoresist formulation may range from about 20 percent to about 30 percent by weight based on the weight of the curable photoresist formulation.

The second difunctional epoxy resin of the present invention is monomeric. A suitable monomeric resin is a naphthalene epoxy resin. A suitable difunctional monomeric naphthalene epoxy resin available from the Dainippon Ink & Chemicals under the trade name EPICLON HP-4032D. The amount of monomeric difunctional epoxy resin in the photoresist formulation ranges from about 2 percent to about 4 percent by weight based on the weight of the curable photoresist formulation.

The photoresist formulation according to embodiments of the disclosure also includes a methide-based photoacid generator. Most importantly the photoacid generator cannot contain antimony. An exemplary photoacid generator is a tris-[4-(4-acetyl-phenylsulfanyl)-phenyl]sulfonium-tris (trisfluoromethanesulfonyl) methide sold under the trade name GSID CD26-1 by the CIBA Company. Upon exposure to i-line radiation (365 nm), the methide-based photoacid generator undergoes photolysis and converts into a super acid with an organic counter anion to induce the cross-linking reaction. The methide-based photoacid generator has good miscibility with many different epoxy resins. The photoacid generator may be present in the photoresist formulation in an amount ranging from about 0.5 to about 2.0 percent by weight based on the weight of the curable photoresist formulation.

The photoresist formulation also contains a multifunctional epoxy component. A suitable multifunctional epoxy component may be selected from aromatic epoxides such as glycidyl ethers of polyphenols. An exemplary multifunctional epoxy resin is a polyglycidyl ether of a phenolformaldehyde novolac resin such as a novolac epoxy resin having an epoxide gram equivalent weight ranging from about 190 to about 250 and a viscosity at 130° C. ranging from about 10 to about 60 poise, which is available from Resolution Performance Products of Houston, Tex. under the trade name EPON RESIN SU-8.

The multi-functional epoxy component of the photoresist formulation according to such an embodiment may have a weight average molecular weight of about 3,000 to about 5,000 Dalton as determined by gel permeation chromatography, and an average epoxide group functionality of greater than 3, such as from about 6 to about 10. The amount of multifunctional epoxy resin in the photoresist formulation ranges from about 20 percent to about 30 percent by weight based on the weight of the curable photoresist formulation.

Tris-[4-(4-acetyl-phenylsulfanyl)-phenyl]-sulfonium-tris-(trisfluoromethanesulfonyl) methide photoacid generator has a high quantum efficiency at i-line radiation. It does not need a high photoacid generator loading in the formulation to be sufficient to perform photo patterning. As the major light absorbent, the photoacid generator has a low loading in photoresist formulation that is relatively transparent. The relationship between optical property (optical density) and photochemical sensitivity is not well balanced. As a result, the photoresist imaging performance can be sensitive to the reflective light from topographic and patterned substrate surface. The reflection can deform the desired patterns and narrow the processing window. In order to suppress the reflection effects, traditionally the employment of a layer of bottom antireflective coating underneath of photoresist layer is an effective way. The drawback of this approach is a more complicated process associated with a few additional processing steps. An alternative method is tuning optical property of formulation. The formulation can use more absorptive resins in the formulation. However an easier way is the addition of i-line absorptive molecules, namely chromophores, into the formulation to increase films optical density to be balanced with photoreactivity. Fused aromatic rings systems such as anthracene, fluorenone, thioxanthenone etc. are broadly absorptive in the range of UV to be chromophores. An exemplary chromophore is isopropyl-9-H-thioxanthen-9-one is sold under trade name of Genocure ITX by the Rahn USA Corporation. The ITX loading can range from about 0.5 percent to about 1.5 percent by weight based on the total weight of the curable photoresist formulation.

The photoresist formulations may optionally include an effective amount of an adhesion enhancing agent such as a silane compound. Silane compounds that are compatible with the components of the photoresist formulation typically have a functional group capable of reacting with at least one member selected from the group consisting of the multifunctional epoxy compound (in embodiments wherein the same is included in the photoresist formulation), the difunctional epoxy compound. Such an adhesion enhancing agent may be a silane with an epoxide functional group such as a glycidoxyalkyltrialkoxysilane, e.g., gamma-glycidoxypropyltrimethoxysilane. When used the adhesion enhancing agent is present in an amount ranging from about 0.5 to about 3.5 weight percent, based on total weight of the curable photoresist formulation, including all ranges subsumed therein. Adhesion enhancing agents, as used herein, are defined to include organic materials soluble in the photoresist composition which assist the film forming and adhesion characteristics of the thick film layer.

In order to produce the thick film layer on a micro-fluid ejection head, a suitable solvent is used. An exemplary solvent is a solvent which is non-photoreactive. Non-photoreactive solvents include, but are not limited to, gamma-butyrolactone, $C_{1-6}$ acetates, tetrahydrofuran, low molecular weight ketones, mixtures thereof and the like. An exemplary non-photoreactive solvent is acetophenone. The non-photoreactive solvent is present in the formulation mixtures used to provide the photoresist layer in an amount ranging of from about 35 to about 45 weight percent, based on the total weight of the photoresist formulation. In an exemplary embodiment, the non-photoreactive solvent does not remain in the cured thick photoresist layer and is thus removed prior to or during the photoresist layer curing steps.

A non-photoreactive solvent and the difunctional epoxy compounds are mixed together in a suitable container, such as an amber bottle or flask and the mixture is put in a roller mill overnight at about 60° C. to assure suitable mixing of the components. After this mixing of the solvent and difunctional epoxy compounds, the multifunctional epoxy compound is added to the container and the resulting mixture is rolled for two hours on a roller mill at about 60° C. The other components, such as the photoacid generator and the optional adhesion enhancing agent, if used, are also added one at a time to the container and the container is rolled for about two hours at about 60° C. after adding all of the components to the container to provide a wafer coating mixture.

A method for making the negative photoresist film layer using the photoresist formulation will now be described. A silicon substrate wafer is centered on an appropriate sized chuck of either a resist spinner or conventional wafer resist deposition track. The photoresist formulation mixture is either dispensed by hand or mechanically into the center of the wafer. The chuck holding the wafer is then rotated at a predetermined number of revolutions per minute to evenly spread the mixture from the center of the wafer to the edge of the wafer. The rotational speed of the wafer may be adjusted or the viscosity of the coating mixture may be altered to vary the resulting resin film thickness. Rotational speeds of 2000 rpm or more may be used. The amount of photoresist formulation applied should be sufficient to provide the thick film layer having the desired thickness for flow features imaged therein. Accordingly, the thickness of thick film layer after curing may range from about 5 to about 30 microns.

The resulting substrate wafer containing the thick film layer is then removed from the chuck either manually or mechanically and placed on either a temperature controlled hotplate or in a temperature controlled oven at a temperature of about 65° C. for about 30 seconds to about 1 minute, then at 95° C. for approximately 1-2 minutes, until the material is "soft" baked. This step removes at least a portion of the solvent from the thick film layer resulting in a partially dried film adjacent the silicon substrate wafer. The wafer is removed from the heat source and allowed to cool to room temperature.

Prior to imaging and developing the thick film layer, a fluid feed slot is formed in the substrate wafer, such as by an etching process. An exemplary etching process is a dry etch process such as deep reactive ion etching or inductively coupled plasma etching. During the etching process, the photoresist layer acts as an etch stop layer.

In order to define flow features in the thick film layer such as a fluid ejection chamber and a fluid supply channel, the thick film layer is masked with a mask containing substantially transparent areas and substantially opaque areas thereon. Areas of the thick film layer masked by the opaque areas of the mask will be removed upon developing to provide the flow features described above.

A radiation source provides actinic radiation to image the thick film layer. A suitable source of radiation emits actinic radiation at a wavelength around 365 nm. Exposure energy of the thick film layer may be from around 100 to higher than 10,000 J/m$^2$, depending upon the amounts of particular epoxy materials and amount of ITX being used in the formulation, distance from the radiation source, and the thickness of the thick film layer. The thick film layer may optionally be exposed to electron beam irradiation instead of ultraviolet radiation.

The foregoing procedure is similar to a standard semiconductor lithographic process. A mask is a clear, flat substrate, usually glass or quartz, with opaque defining the areas to be removed from the layer (i.e. a negative acting photoresist layer). The opaque areas prevent the ultraviolet light from cross-linking the layer masked beneath it. The exposed areas of the layer provided by the substantially transparent areas of the mask are subsequently baked at a temperature of about 90° C. for about 30 seconds to about 10 minutes, such as from about 1 to about 5 minutes to define the pattern in the thick film layer. During the bake processing steps, the epoxy resins cross-link in exposed areas and loss the solubility.

The non-exposed areas of the thick negative photoresist film layer are then solubilized by a developer and the solubilized material is removed leaving the imaged and developed thick film layer adjacent the device surface of the substrate. The developer comes in contact with the substrate and thick film layer through either immersion and agitation in a tank-like setup or by spraying the developer on the substrate and thick film layer. Either spray or immersion will adequately remove the non-imaged material. Illustrative developers include, for example, butyl cellosolve acetate, a xylene and butyl cellosolve acetate mixture, and $C_{1-6}$ acetates like butyl acetate and 2-(1-methoxy)propyl acetate. After developing the layer, the substrate with the layer is optionally baked at a temperature ranging from about 150° C. to about 200° C., such as from about from about 170° C. to about 190° C. for about 1 minute to about 60 minutes, such as from about 15 to about 30 minutes.

The formulation used to make the photoresist layer described above is as follows:

TABLE 1

| Component | Amount in curable thick film formulation (wt. %) |
|---|---|
| Difunctional epoxy component (EPON 1007F) | 26.41 |
| Multifunctional epoxy component (EPON SU-8) | 26.41 |
| Difunctional monomeric epoxy component (HP4032D) | 2.64 |
| tris-[4-(4-acetyl-phenyldulfanyl)-phenyl]sulfonium-tris(trisfluoromethanesulfonyl)methide (GSID 26-1) | 1.27 |
| Glycidoxypropyltrimethoxysilane | 1.17 |
| Chromophore (ITX) | .90 |
| Acetophenone | 41.20 |

TABLE 2

| Component | Amount in curable thick film formulation (wt. %) |
|---|---|
| Difunctional epoxy component (EPON 1007F) | 27.21 |
| Multifunctional epoxy component (EPON SU-8) | 27.21 |
| Difunctional monomeric epoxy component (HP4032D) | 2.72 |
| tris-[4-(4-acetyl-phenyldulfanyl)-phenyl]sulfonium-tris(trisfluoromethanesulfonyl)methide (GSID 26-1) | 1.14 |
| Glycidoxypropyltrimethoxysilane | 1.21 |
| Chromophore (ITX) | .77 |

TABLE 2-continued

| Component | Amount in curable thick film formulation (wt. %) |
|---|---|
| Acetophenone | 39.73 |

The thick film photoresist layers made with the formulations set forth in Tables 1 and 2 provided substantially improved image resolution. For example, such a thick film layer had a resolution of greater than about 3 microns (e.g., at 13 to 15 microns thickness), with an aspect ratio of less than about 4:1 (e.g., about 2:1). Moreover, these photoresist layers provide the necessary well defined critical dimensions, straight side walls and large processing windows. Accordingly, very high quality printheads are made when these photoresist layers are incorporated thereon.

Another formulation which may be used to provide environmentally friendly thick film layers is illustrated in Table 3. In this embodiment, the monomeric difunctional epoxy resin is a diglcidyl bis-phenol-A ether available from the Dainippon Ink and Chemical company under the trade name EXA-850-CRP. Moreover this formulation does not contain a chromophore or an adhesion enhancer. This formulation also provides good image resolution, well defined critical dimensions, stronger side walls and a large processing window.

TABLE 3

| Component | Amount in curable thick film formulation (wt. %) |
|---|---|
| Difunctional epoxy component (EPON 1007F) | 25.48 |
| Multifunctional epoxy component (EPON SU-8) | 25.48 |
| Difunctional epoxy component (EXA-850-CRP) | 7.65 |
| tris-[4-(4-acetyl-phenyldulfanyl)-phenyl]sulfonium-tris(trisfluromethanesulfonyl)methide (GSID 26-1) | 0.61 |
| Acetophenone | 40.77 |

Having described various aspects and exemplary embodiments and several advantages thereof, it will be recognized by those of ordinary skills that the disclosed embodiments are susceptible to various modifications, substitutions and revisions within the spirit and scope of the appended claims.

What is claimed is:

1. An environmentally friendly negative photoresist thick film layer for a micro-fluid ejection head, the photoresist film layer being derived from a composition comprising:
    from about 20 to about 30 percent by weight of a low molecular weight polymeric difunctional epoxy component having a weight average molecular weight ranging from about 2500 to about 4000 Daltons,
    from about 20 to about 30 percent by weight of a multifunctional epoxy component,
    from about 2 to about 3 percent by weight of a monomeric difunctional epoxy component,
    from about 0.5 to about 2 percent by weight of a tris-[4-(4-acetyl-phenylsulfanyl) -phenyl]sulfonium-tris(trisfluoromethanesulfonyl)methide photoacid generator,
    from about 0.5 to about 1.5 percent by weight of a chromophore, and a balance aryl ketone solvent,
    wherein, upon curing, the environmentally friendly photoresist film layer has a thickness ranging from about 5 to about 30 microns.

2. The environmentally friendly thick film layer of claim 1, wherein the chromophore comprises isopropyl-9-H-thioxanthen-9-one.

3. The environmentally friendly thick film layer of claim 1, wherein the aryl ketone solvent comprises acetophenone.

4. The environmentally friendly thick film layer of claim 1 further comprising an adhesion enhancer having an alkoxysilane compound.

5. The environmentally friendly thick film layer of claim 4, wherein the alkoxysilane compound comprises gamma-glycidoxypropyltrimethoxysilane.

6. The environmentally friendly thick film layer of claim 1, wherein the composition includes substantially equal parts of the multifunctional epoxy compound and the low molecular weight polymeric difunctional epoxy compound.

7. The environmentally friendly thick film layer of claim 1, wherein the tris-[4-(4-acetyl-phenylsulfanyl)-phenyl]sulfonium-tris(trisfluoromethanesulfonyl)methide photoacid generator is sensitive to i-line radiation at around 365 nm.

8. An environmentally friendly thick film layer for a micro-fluid ejection head, comprising a negative photoresist layer derived from a composition comprising:
    from about 20 to about 30 percent by weight of a multifunctional epoxy compound,
    from about 20 to about 30 percent by weight of a low molecular weight polymeric difunctional epoxy compound,
    from about 6 to about 9 percent by weight of a monomeric difunctional epoxy compound,
    from about 1 to about 2 percent by weight of a tris-[4-(4-acetyl-phenylsulfanyl) -phenyl]sulfonium-tris(trisfluoromethanesulfonyl)methide photoacid generator devoid of antimony, and
    a balance aryl ketone solvent,
    wherein the negative photoresist layer has a thickness ranging from about 5 to about 30 microns.

9. The environmentally friendly thick film layer of claim 8 wherein the aryl ketone solvent comprises acetophenone.

10. The environmentally friendly thick film layer of claim 8, wherein the methide tris-[4-(4-acetyl-phenylsulfanyl)-phenyl]sulfonium-tris(trisfluoromethanesulfonyl) methide photoacid generator is sensitive to i-line radiation at around 365 nm.

11. The environmentally friendly thick film layer of claim 8, wherein the composition includes substantially equal parts of the multifunctional epoxy compound and the low molecular weight polymeric difunctional epoxy compound.

* * * * *